(12) United States Patent
Kuo et al.

(10) Patent No.: US 9,472,612 B2
(45) Date of Patent: Oct. 18, 2016

(54) INTEGRATED CAPACITOR

(71) Applicant: Taiwan Semiconductor Manufacturing Company, Ltd., Hsin-Chu (TW)

(72) Inventors: Chin-Wei Kuo, Zhubei (TW); Cheng-Wei Luo, Hsin-Chu (TW); Hsiao-Tsung Yen, Tainan (TW); Jun-Cheng Huang, Zhubei (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/071,014

(22) Filed: Mar. 15, 2016

(65) Prior Publication Data

US 2016/0197137 A1    Jul. 7, 2016

Related U.S. Application Data

(62) Division of application No. 13/902,575, filed on May 24, 2013, now Pat. No. 9,331,013.

(60) Provisional application No. 61/784,117, filed on Mar. 14, 2013.

(51) Int. Cl.
*H01L 49/02*    (2006.01)

(52) U.S. Cl.
CPC ..................................... *H01L 28/87* (2013.01)

(58) Field of Classification Search
CPC ....... H01L 28/60; H01L 28/86; H01L 28/87; H01L 28/91
See application file for complete search history.

(56) References Cited

U.S. PATENT DOCUMENTS

| | | |
|---|---|---|
| 6,653,681 B2 | 11/2003 | Appel |
| 7,202,548 B2 | 4/2007 | Lee |
| 7,485,914 B2 | 2/2009 | Huang et al. |
| 7,645,675 B2 | 1/2010 | Coolbaugh et al. |
| 7,956,438 B2 | 6/2011 | Quinn |
| 8,330,251 B2 | 12/2012 | Chang et al. |
| 2010/0044833 A1 | 2/2010 | Cheng et al. |
| 2010/0271753 A1 | 10/2010 | Wang et al. |
| 2011/0149468 A1 | 6/2011 | Picollet et al. |

*Primary Examiner* — Whitney T Moore
(74) *Attorney, Agent, or Firm* — Slater Matsil, LLP

(57) ABSTRACT

A method includes forming first, second, and third conductive leaf structures. The first conductive leaf structure includes a first conductive midrib and conductive veins. The second conductive leaf structure is electrically connected to the first conductive leaf structure, and includes a second conductive midrib, conductive veins extending toward the first conductive midrib, and conductive veins extending away from the first conductive midrib. The third conductive leaf structure includes a third conductive midrib between the first conductive midrib and the second conductive midrib, conductive veins extending toward the first conductive midrib, and conductive veins extending toward the second conductive midrib.

20 Claims, 7 Drawing Sheets

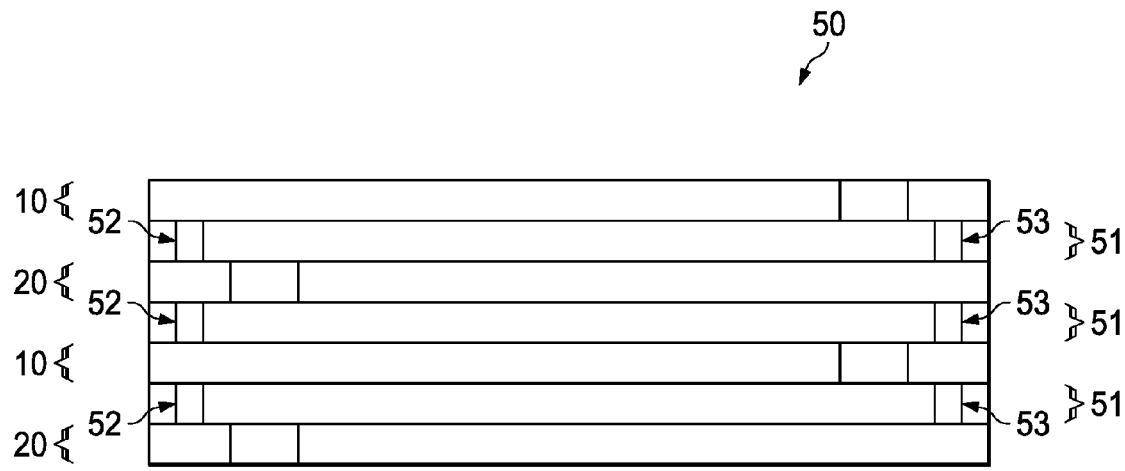
FIG. 5
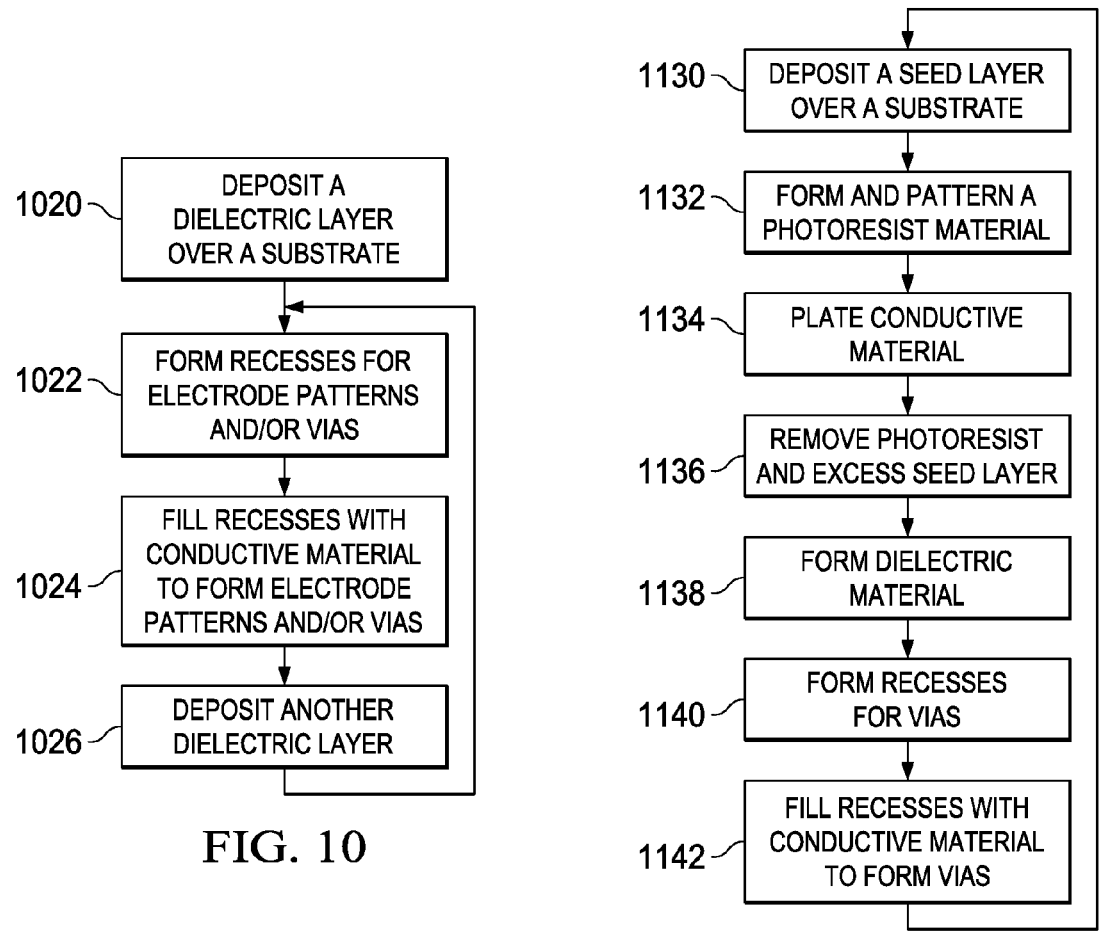
FIG. 10
FIG. 11

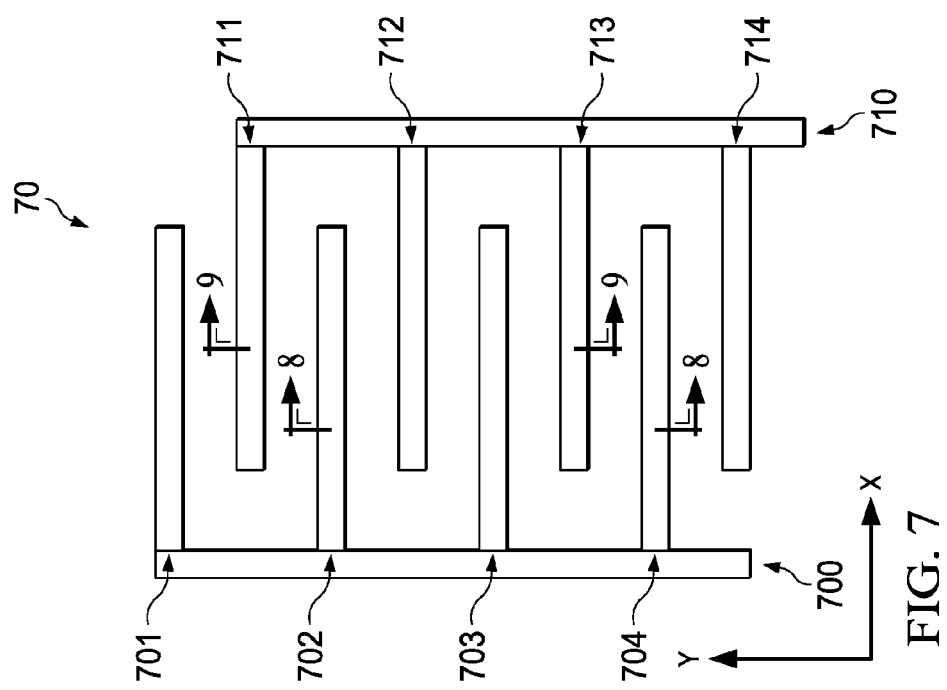
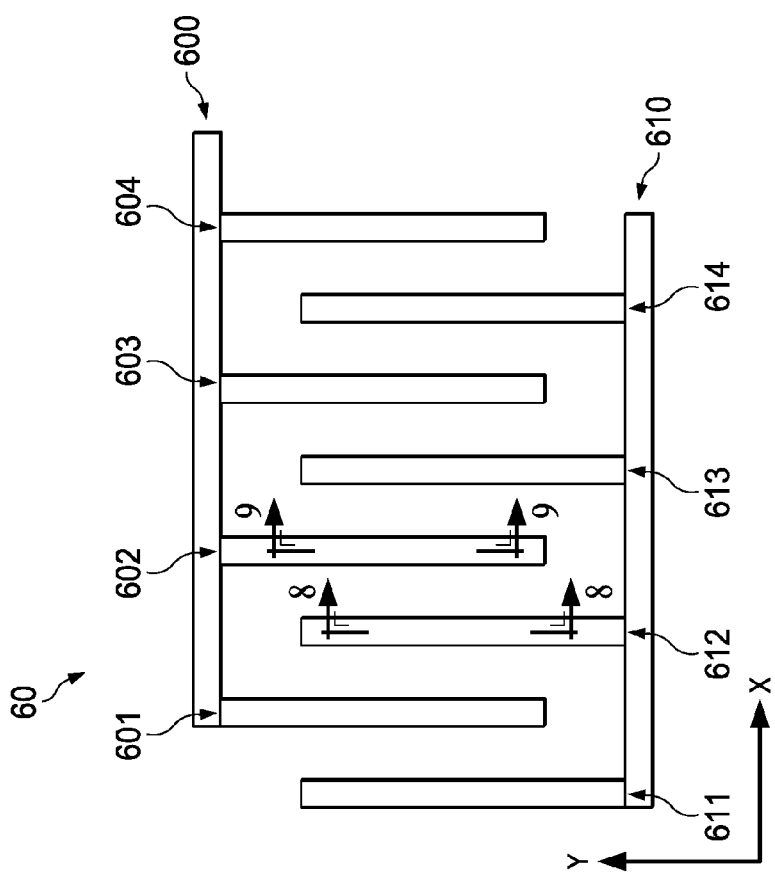
FIG. 7
FIG. 6

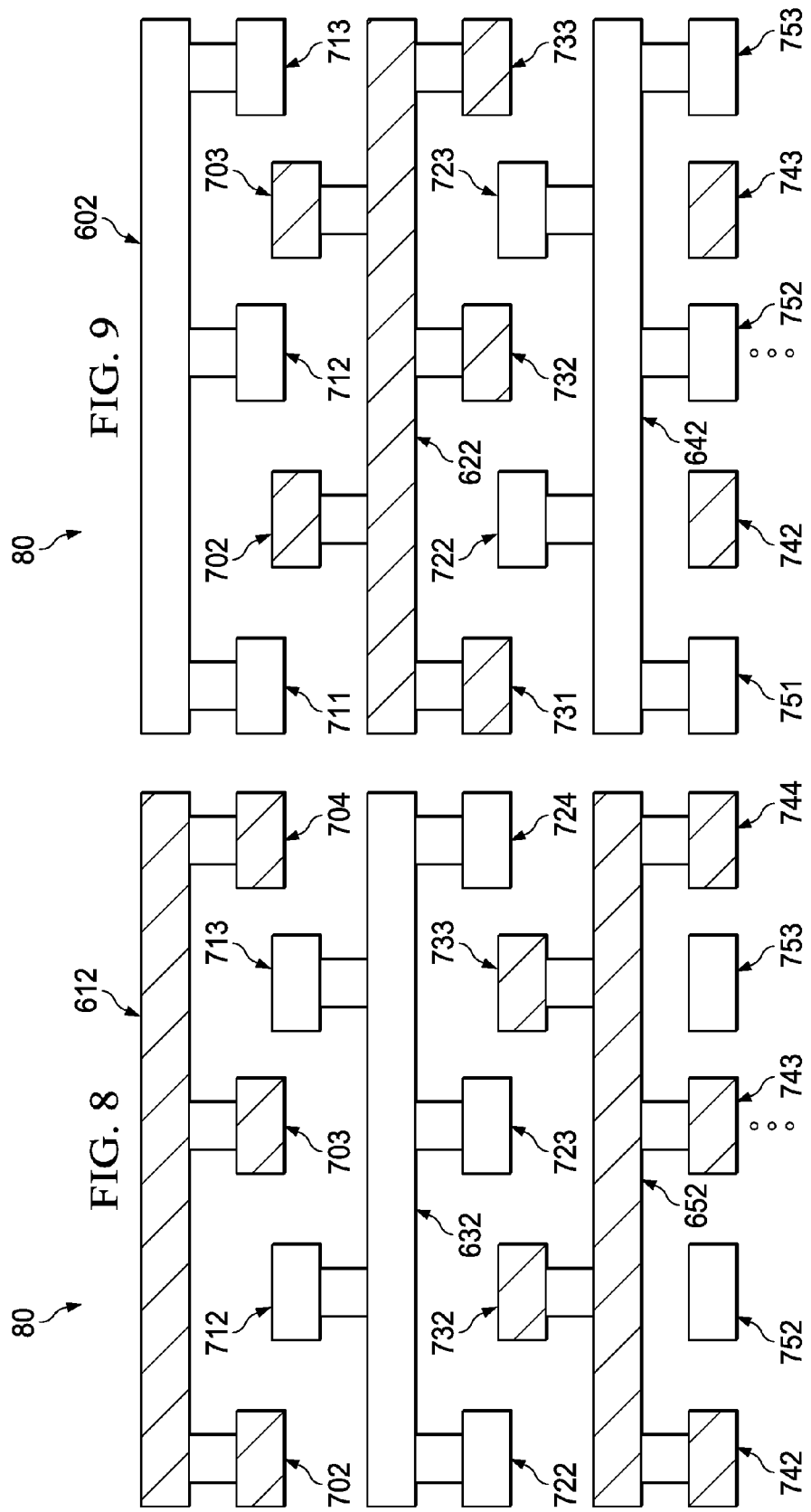

INTEGRATED CAPACITOR

CROSS-REFERENCE TO RELATED APPLICATIONS

This application claims the benefit of U.S. patent application Ser. No. 13/902,575, filed on May 24, 2013, entitled "Integrated Capacitor," and U.S. Provisional Patent Application Ser. No. 61/784,117, filed on Mar. 14, 2013, entitled "Capacitor Structures and Methods of Forming the Same," which applications are incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). Integrated capacitors, a charge storage component used in many integrated circuit applications, come in various types, including metal-oxide-metal (MOM) capacitors, metal-insulator-metal (MIM) capacitors, metal-oxide-semiconductor (MOS) varactors, and the like.

BRIEF DESCRIPTION OF THE DRAWINGS

For a more complete understanding of representative embodiments, and the advantages thereof, reference is now made to the following descriptions taken in conjunction with the accompanying drawings, in which:

FIG. 5 is a diagram of an integrated capacitor in accordance with various embodiments of the present disclosure;

FIGS. 6, 7, 8, and 9 are diagrams of an integrated capacitor with vertical orientation in accordance with various embodiments of the present disclosure;

FIG. 10 is a process flow to form a capacitor according to various embodiments of the present disclosure; and FIG. 11 is another process flow to form a capacitor according to various embodiments of the present disclosure.

DETAILED DESCRIPTION OF ILLUSTRATIVE EMBODIMENTS

The making and using of representative embodiments are discussed in detail below. It should be appreciated, however, that the present disclosure provides many applicable inventive concepts that may be embodied in a wide variety of specific contexts. The specific embodiments discussed are merely illustrative of representative ways to make and use the disclosed subject matter, and do not limit the scope of the disclosed embodiments.

Embodiments will be described with respect to a specific context, namely integrated capacitors with horizontal and vertical leaf-type structures. Other embodiments may also be applied, however, to other types of integrated devices.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be, and usually is, applicable for many components within a structure.

Integrated capacitors, such as MIM capacitors, MOM capacitors, MOS varactors, and the like, have many and various uses in integrated circuit (IC) applications. Integrated capacitors are rated in terms of performance metrics, including, e.g., capacitance density (area), operating frequency, quality factor (Q), process variation, and parasitic performance, among others.

In the following disclosure, novel integrated capacitors with leaf-type structure are introduced. Such integrated capacitors may use metal fingers with substantially perpendicular offshoot fingers to improve at least parasitic performance (e.g., parasitic resistance and inductance) of the integrated capacitor while maintaining high capacitor density (capacitance/area).

FIG. 1 to FIG. 4 are diagrams of integrated capacitor structures 10, 20, 30, and 40 in accordance with various representative embodiments of the present disclosure. Perpendicular axes X and Y (or, X axis and Y axis) are depicted in FIG. 1 to FIG. 4 as an aid for describing features of the Figures. A further Z axis may be defined orthogonal to both the X and Y axes, with positive direction coming out of the page according to the right hand rule.

Figure 1:
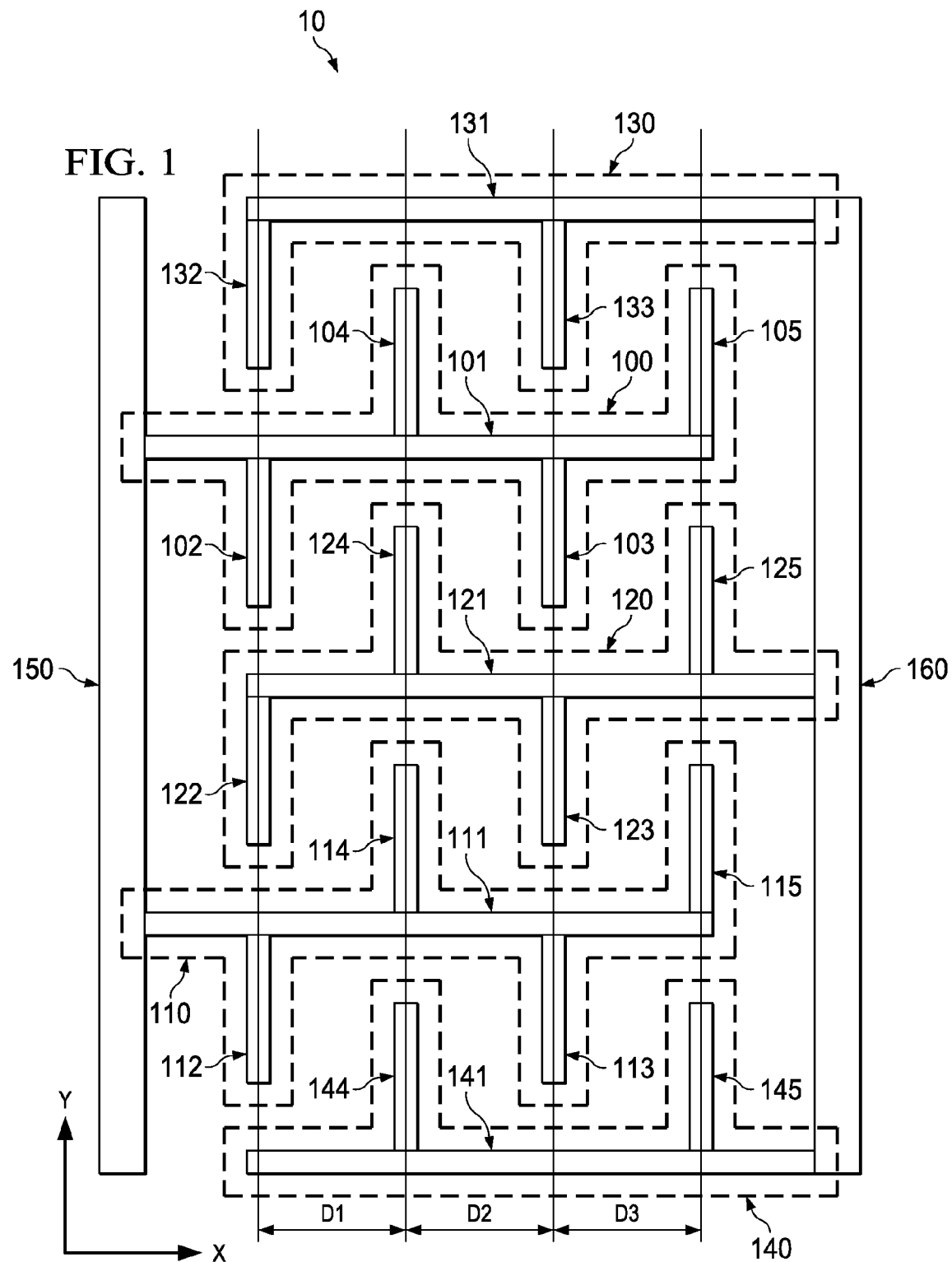
FIGS. 1 to 4 are diagrams of integrated capacitor structures in accordance with various embodiments of the present disclosure.

Referring now to FIG. 1, a first conductive port (or line) 150 is formed in a metal layer on a semiconductor substrate, and extends lengthwise along the Y axis. A second conductive port (or line) 160 is also formed in a metal layer. The first conductive port 150 is substantially parallel to the second conductive port 160. In some embodiments, the first conductive port 150 and the second conductive port 160 are in a first metal layer. In other embodiments, the first conductive port 150 is in a different metal layer than the second conductive port 160 (e.g., a second metal layer).

A first separation separates the first conductive port 150 from the second conductive port 160 by a distance measured along the X axis. At least two leaf-shaped conductive features (including first, second, and third leaf-shaped conductive features 100, 110, 120 in FIG. 1) are in the first separation between the first conductive port 150 and the second conductive port 160. In some embodiments, first and second fin-shaped conductive features 130, 140 are also in the first separation between the first conductive port 150 and the second conductive port 160 on either side of the at least two leaf-shaped conductive features, as representatively shown in FIG. 1. Dielectric material extends between the at least two leaf-shaped conductive features. In some embodiments, the dielectric completely fills in between and contacts the first conductive port 150, the second conductive port 160, the first, second, and third leaf-shaped conductive features 100, 110, 120, and the first and second fin-shaped conductive features 130, 140.

A first conductive midrib 101 of the first leaf-shaped conductive feature 100 comprises a conductive line that extends lengthwise along the X axis, substantially perpendicular to the first conductive port 150. The first conductive midrib 101 is electrically connected to the first conductive port 150. In some embodiments, the first conductive midrib 101 may be monolithic with the first conductive port 150, formed in the first metal layer. In other embodiments, the first conductive midrib 101 is formed in another metal layer above or below the first metal layer, and is electrically connected to the first conductive port 150 through a connective structure including, for example, a conductive via.

A second conductive midrib 111 of the second leaf-shaped conductive feature 110 is a conductive line that extends lengthwise along the X axis, substantially perpendicular to the first conductive port 150. The second conductive midrib 111 is electrically connected to the first conductive port 150. In some embodiments, the second conductive midrib 111 may be monolithic with the first conductive port 150, formed in the first metal layer. In other embodiments, the second conductive midrib 111 is formed in another metal layer above or below the first metal layer, and is electrically connected to the first conductive port 150 through a connective structure including, for example, a conductive via. A second separation separates the second conductive midrib 111 from the first conductive midrib 101. A third separation separates the first conductive midrib 101 from a first conductive spine 131 of the first fin-shaped conductive feature 130. A fourth separation separates the second conductive midrib 111 from a second conductive spine 141 of the second fin-shaped conductive feature 140. In some embodiments, external connections (e.g., positive/negative plate connections) to the integrated capacitor structure 10 may be made using lines or ports connected to the first conductive spine 131 and the second conductive spine 141. In other embodiments, external connections to the integrated capacitor structure 10 may be made at the first conductive port 150 and the second conductive port 160. In other embodiments, external connection to the integrated capacitor structure 10 may be made at the first conductive spine 131 and the first conductive port 150, or at the second conductive spine 141 and the second conductive port 160.

The third leaf-shaped conductive feature 120 is in the second separation between the first conductive midrib 101 and the second conductive midrib 111. A third conductive midrib 121 of the third leaf-shaped conductive feature 120 is a conductive line that extends lengthwise along the X axis, substantially perpendicular to the second conductive port 160. The third conductive midrib 121 is electrically connected to the second conductive port 160. In some embodiments, the third conductive midrib 121 may be monolithic with the second conductive port 160, formed in the first metal layer. In other embodiments, the third conductive midrib 121 is formed in another metal layer above or below the first metal layer, and is electrically connected to the second conductive port 160 through a connective structure including, for example, a conductive via. In some embodiments, the third leaf-shaped conductive feature 120 is formed in the same metal layer as the first and second leaf-shaped conductive features 100, 110.

First conductive veins 104, 105 and second conductive veins 102, 103 comprise conductive stubs, and extend substantially perpendicularly from the first conductive midrib 101 in different (opposite or anti-parallel) directions along the Y axis. For example, the first conductive veins 104, 105 may extend in the positive Y direction, and the second conductive veins 102, 103 may extend in the negative Y direction, as representatively illustrated in FIG. 1. In some embodiments, the first conductive veins 104, 105 and the second conductive veins 102, 103 may be arranged in a staggered formation. As shown, a first distance D1 separates the first conductive vein 104 from the second conductive vein 102. A second distance D2 separates the first conductive vein 104 from the second conductive vein 103. A third distance D3 separates the first conductive vein 105 from the second conductive vein 103. In some embodiments, the first conductive veins 104, 105 and the second conductive veins 102, 103 may be monolithic with the first conductive midrib 101. In other embodiments, the first conductive veins 104, 105 and the second conductive veins 102, 103 are electrically connected to the first conductive midrib 101 through a connecting structure (e.g., a conductive via).

Third conductive veins 114, 115 and fourth conductive veins 112, 113 comprise conductive stubs, and extend substantially perpendicularly from the second conductive midrib 111 in different (opposite or anti-parallel) directions along the Y axis. For example, the third conductive veins 114, 115 may extend in the positive Y direction (toward the first conductive midrib 101), and the fourth conductive veins 112, 113 may extend in the negative Y direction (away from the first conductive midrib 101), as representatively illustrated in FIG. 1. The third conductive veins 114, 115 and the fourth conductive veins 112, 113 may be arranged in a staggered formation. As shown, the first distance D1 separates the third conductive vein 114 from the fourth conductive vein 112. The second distance D2 separates the third conductive vein 114 from the fourth conductive vein 113. The third distance D3 separates the third conductive vein 115 from the fourth conductive vein 113. In some embodiments, the third conductive veins 114, 115 and the fourth conductive veins 112, 113 may be monolithic with the second conductive midrib 111. In other embodiments, the third conductive veins 114, 115 and the fourth conductive veins 112, 113 are electrically connected to the second conductive midrib 111 through a connecting structure (e.g., a conductive via).

Fifth conductive veins 124, 125 and sixth conductive veins 122, 123 comprise conductive stubs, and extend substantially perpendicularly from the third conductive midrib 121 in different (opposite or anti-parallel) directions along the Y axis. For example, the fifth conductive veins 124, 125 may extend in the positive Y direction (toward the first conductive midrib 101), and the sixth conductive veins 122, 123 may extend in the negative Y direction (toward the second conductive midrib 111), as representatively illustrated in FIG. 1. The fifth conductive veins 124, 125 and the sixth conductive veins 122, 123 may be arranged in a staggered formation. As shown, the first distance D1 separates the fifth conductive vein 124 from the sixth conductive vein 122. The second distance D2 separates the fifth conductive vein 124 from the sixth conductive vein 123. The third distance D3 separates the fifth conductive vein 125 from the sixth conductive vein 123. In some embodiments, the fifth conductive veins 124, 125 and the sixth conductive veins 122, 123 may be monolithic with the third conductive midrib 121. In other embodiments, the fifth conductive veins 124, 125 and the sixth conductive veins 122, 123 are electrically connected to the third conductive midrib 121 through a connecting structure (e.g., a conductive via).

The first and second fin-shaped conductive features 130, 140 bracket the first, second, and third leaf-shaped conductive features 100, 110, 120. The first conductive spine 131 of the first fin-shaped conductive feature 130 comprises a conductive line that extends substantially perpendicularly from the second conductive port 160 (e.g., in the X direction). A first conductive ray 132 extends substantially perpendicularly from the first conductive spine 131. In some embodiments, the first conductive ray 132 may be substantially aligned with the second, fourth, and sixth conductive veins 102, 112, 122. A second conductive ray 133 extends substantially perpendicularly from the first conductive spine 131. In some embodiments, the second conductive ray 133 is substantially aligned with the second, fourth, and sixth conductive veins 103, 113, 123.

The second conductive spine 141 of the second fin-shaped conductive feature 140 comprises a conductive line that extends substantially perpendicularly from the second conductive port 160 (e.g., in the X direction). A third conductive ray 144 extends substantially perpendicularly from the second conductive spine 141. In some embodiments, the third conductive ray 144 may be substantially aligned with the first, third, and fifth conductive veins 104, 114, 124. A fourth conductive ray 145 extends substantially perpendicularly from the second conductive spine 141. In some embodiments, the fourth conductive ray 145 is substantially aligned with the first, third, and fifth conductive veins 105, 115, 125.

In some embodiments, the first, second, third, fourth, fifth, and sixth conductive veins 102-105, 112-115, 122-125 and the first through fourth conductive rays 132, 133, 144, 145 have substantially the same physical dimensions (e.g., length, width, thickness). In other embodiments, at least one of the first, second, third, fourth, fifth, and sixth conductive veins 102-105, 112-115, 122-125 and the first through fourth conductive rays 132, 133, 144, 145 may have one or more physical dimensions that differ from the physical dimensions of the other conductive veins and rays.

In some embodiments, the first distance D1, the second distance D2, and the third distance D3 shown in FIG. 1 are non-zero and substantially the same. In other embodiments, the first distance D1, the second distance D2, and the third distance D3 may be different. For example, in FIG. 3, the first distance D1 is substantially zero, and the third distance D3 is substantially zero.

In some embodiments, the second, fourth and sixth conductive veins 102, 112, 122 may be substantially aligned. In some embodiments, the second, fourth and sixth conductive veins 103, 113, 123 may be substantially aligned. In some embodiments, the first, third and fifth conductive veins 104, 114, 124 are substantially aligned. In some embodiments, the first, third and fifth conductive veins 105, 115, 125 are substantially aligned.

Figure 2:
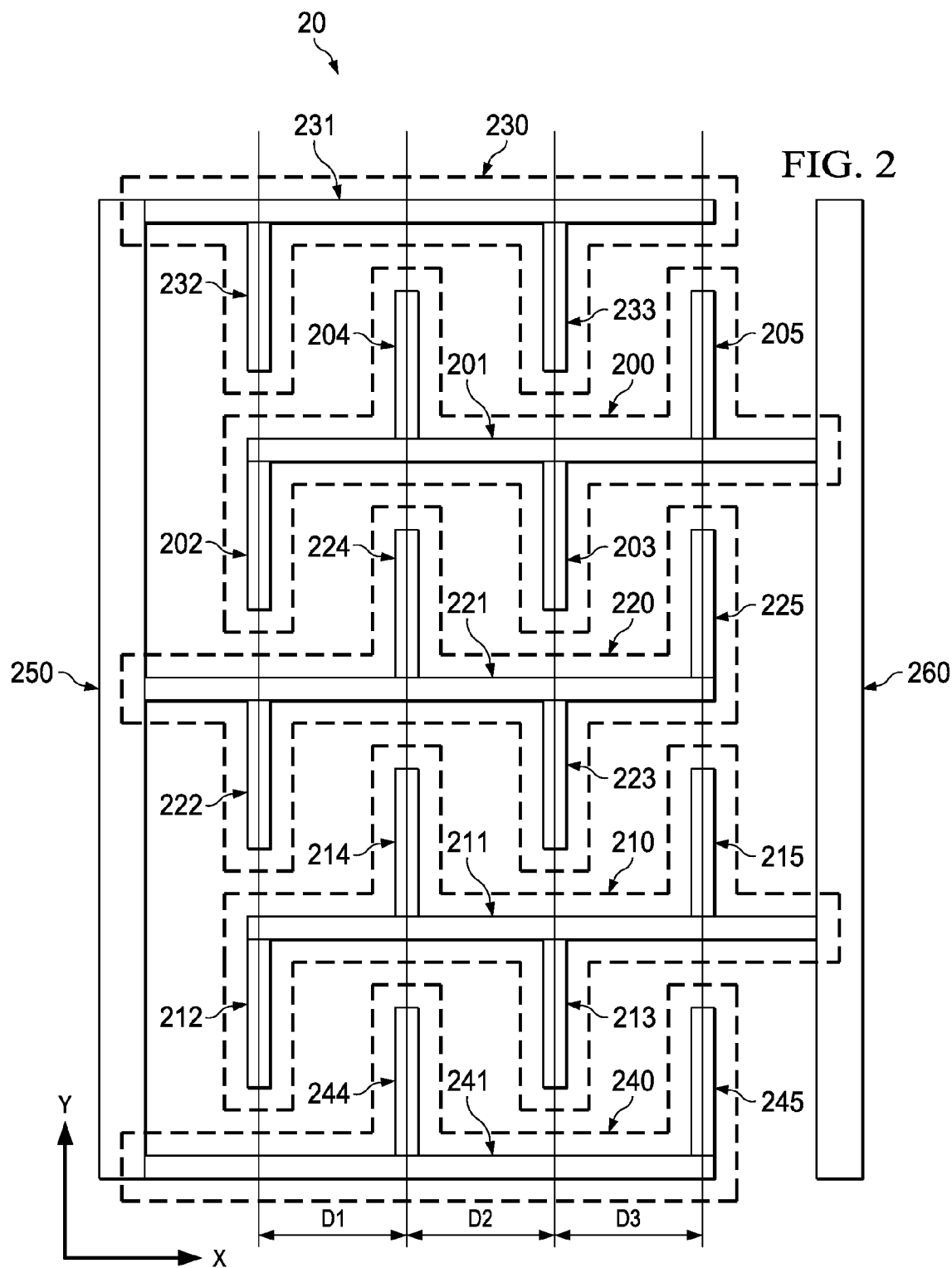
Figure 3:
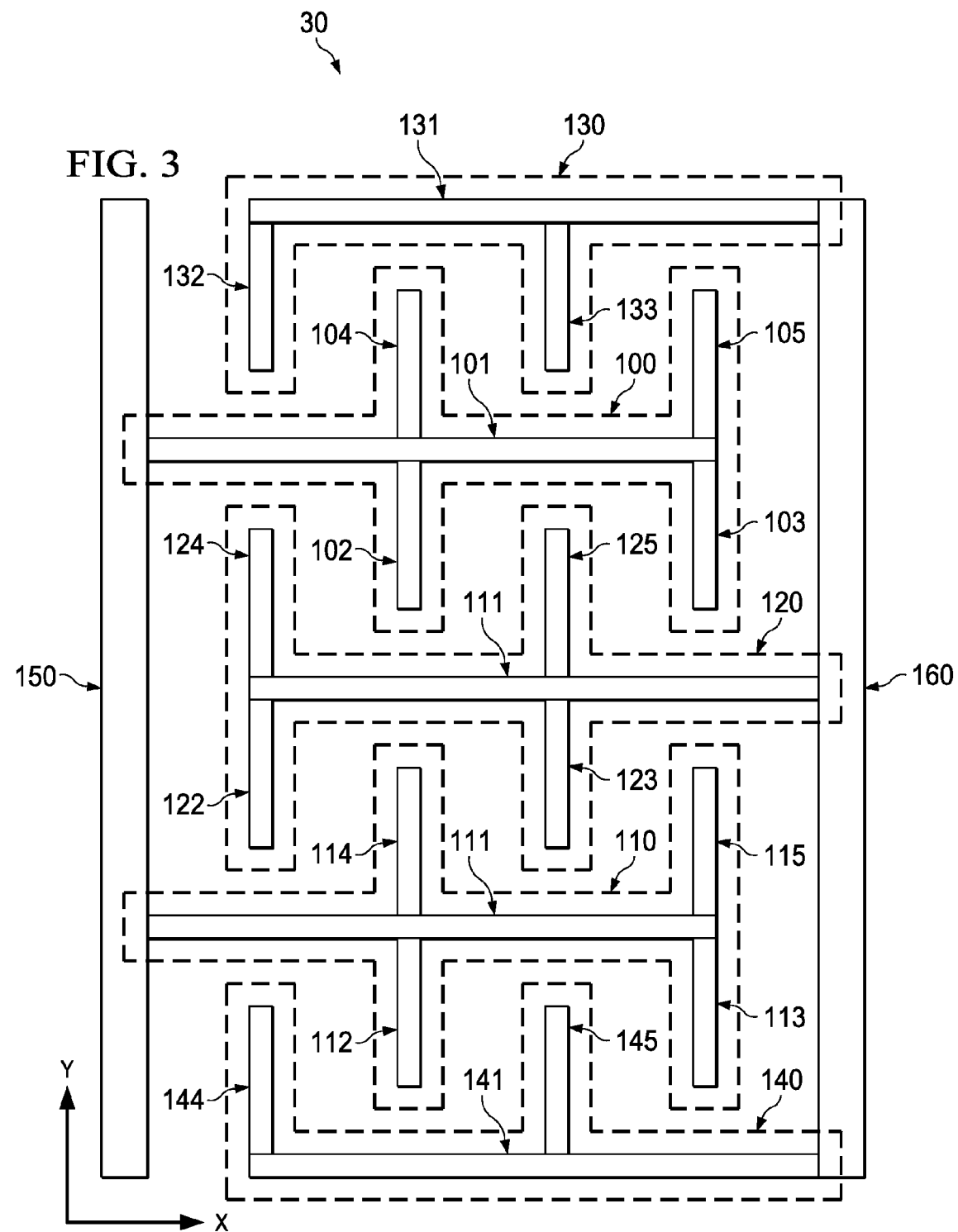
Figure 4:
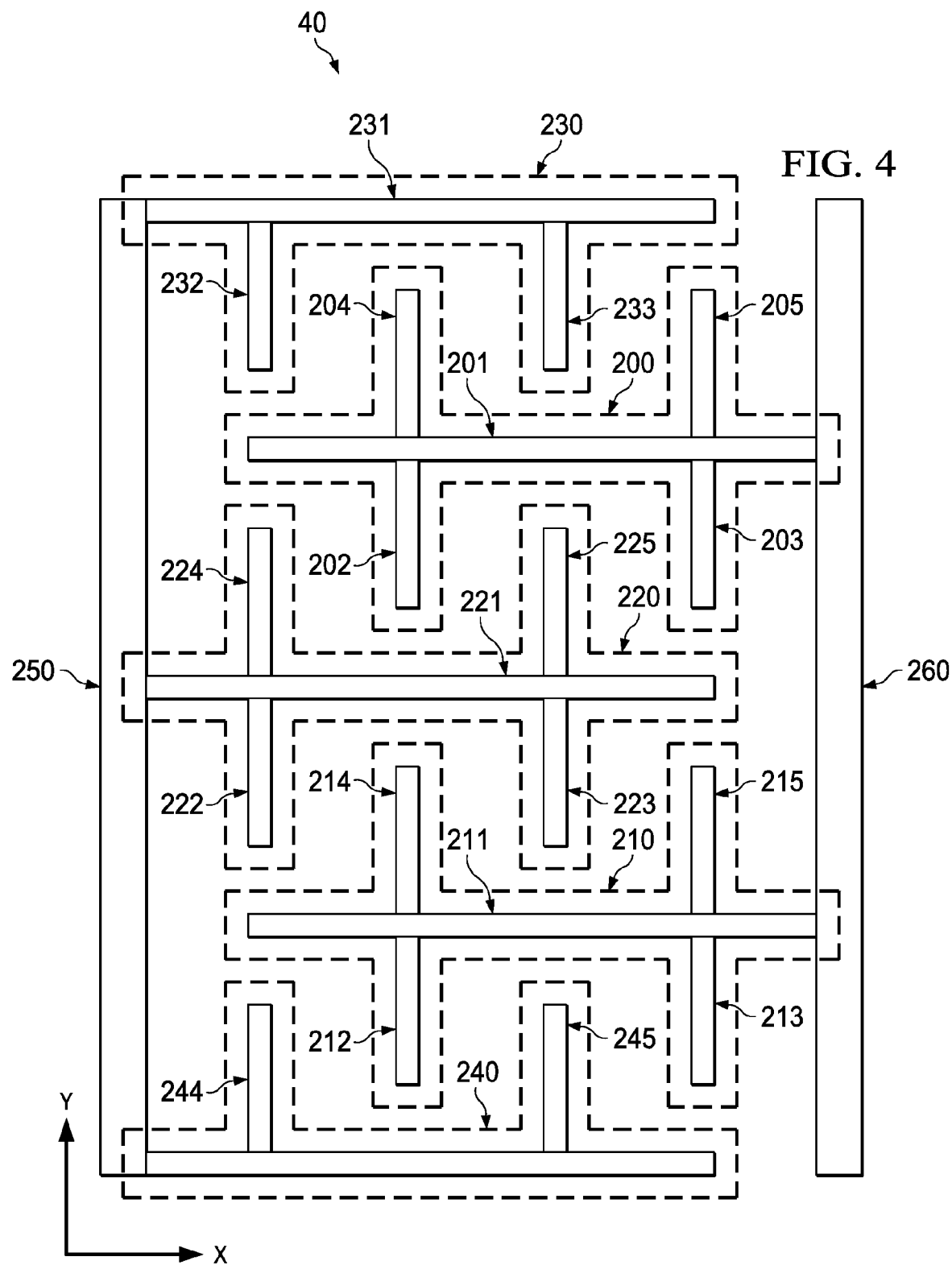

In some embodiments, the integrated capacitor structure 10 may be electrically connected to the integrated capacitor structure 20 of FIG. 2 to form a metal-insulator-metal capacitor. The integrated capacitor structure 20 has many similarities to the integrated capacitor structure 10, and will be described briefly here; highlighting differences in interconnections and physical relationships between the integrated capacitor structures 10, 20. The integrated capacitor structure 20 includes first, second, and third leaf-shaped conductive features 200, 210, 220 that are mostly aligned with the first, second, and third leaf-shaped conductive features 100, 110, 120 of the integrated capacitor structure 10, respectively.

The first and second leaf-shaped conductive features 200, 210 are electrically connected to a second conductive port 260. The third leaf-shaped conductive feature 220 is electrically connected to a first conductive port 250. In some embodiments, external connections (e.g., positive/negative plate connections) to the integrated capacitor structure 20 may be made using lines or ports connected to the first conductive spine 231 and the second conductive spine 241. In other embodiments, external connections to the integrated capacitor structure 20 may be made at the first conductive port 250 and the second conductive port 260. In other embodiments, external connection to the integrated capacitor structure 20 may be made at the first conductive spine 231 and the first conductive port 250, or at the second conductive spine 241 and the second conductive port 260. First, second, and third conductive midribs 201, 211, 221 of the integrated capacitor structure 20 are mostly aligned with the first, second, and third conductive midribs 101, 111, 121, respectively. Slight misalignment between, for example, the first conductive midribs 101, 201 may occur along the X axis due to the first conductive midrib 101 being electrically connected to the first conductive port 150, while the first conductive midrib 201 is electrically connected to the second conductive port 260. First, second, third, fourth, fifth, and sixth conductive veins 202-203, 204-205, 212-213, 214-215, 222-223, 224-225 of the integrated capacitor structure 20 are substantially aligned with the first, second, third, fourth, fifth, and sixth conductive veins 102-103, 104-105, 112-113, 114-115, 122-123, 124-125, respectively.

First and second fin-shaped conductive features 230, 240 of the integrated capacitor structure 20 are mostly aligned with the first and second fin-shaped conductive features 130, 140, respectively. First, second, third, and fourth conductive rays 232, 233, 244, 245 of the first and second fin-shaped conductive features 230, 240 are substantially aligned with the first, second, third, and fourth conductive rays 132, 133, 144, 145 of the first and second fin-shaped conductive features 230, 240, respectively. First and second conductive spines 231, 241 of the first and second fin-shaped conductive features 230, 240 are mostly aligned with the first and second conductive spines 131, 141, with slight misalignment again due to, for example, the second conductive spine 241 being electrically connected to the first conductive port 250, while the second conductive spine 141 is electrically connected to the second conductive port 160.

In some embodiments, the first distance D1, the second distance D2, and the third distance D3 shown in FIG. 2 are non-zero and substantially the same, and are substantially equal to the first distance D1, the second distance D2, and the third distance D3 shown in FIG. 1. In other embodiments, the first distance D1, the second distance D2, and the third distance D3 may be different. For example, in FIG. 4, the first distance D1 is substantially zero, and the third distance D3 is substantially zero.

In an embodiment, integrated capacitor structures 10 and 20 may be electrically coupled together to form a capacitor. The first conductive port 250 of the integrated capacitor structure 20 is electrically connected to the first conductive port 150 through, for example, conductive vias. The second conductive port 260 is electrically connected to the first conductive port 150 through, for example, conductive vias. The integrated capacitor structure 20 is separated from the integrated capacitor structure 10 by a dielectric layer. Based on this interconnection scheme and physical arrangement of the integrated capacitor structures 10, 20, capacitive coupling is established between conductive features electrically connected to the first conductive ports 150, 250 and conductive features electrically connected to the second conductive ports 160, 260. For example, the first leaf-shaped conductive feature 100 is electrically insulated from, and overlaps, the first leaf-shaped conductive feature 200. Further capacitive coupling may be established internally within the integrated capacitor structure 10 or the integrated capacitor structure 20. For example, the second conductive vein 102 may be capacitively coupled to the fifth conductive vein 124, the second conductive vein 103 may be capacitively coupled to the fifth conductive vein 124, and the fifth conductive vein 125 may be capacitively coupled to the second conductive vein 103.

FIG. 5 is a diagram of an integrated capacitor 50 in accordance with various representative embodiments of the present disclosure. In some embodiments, the integrated capacitor 50 includes multiple layers of the integrated capacitor structure 10 and the integrated capacitor structure 20, as well as dielectric layers 51 (e.g., interlayer dielectric, abbreviated "ILD," or inter-metal dielectric, abbreviated "IMD") between the integrated capacitor structures 10, 20, and at least two conductive vias 52, 53 in each dielectric layer 51 electrically connecting the first and second conductive ports 150, 160 of the integrated capacitor structure 10 to the first and second conductive ports 250, 260 of the integrated capacitor structure 20, respectively. For example, the integrated capacitor 50 shown in FIG. 5 includes two integrated capacitor structures 10, two integrated capacitor structures 20, and three dielectric layers 51.

The leaf-shaped conductive features 100, 110, 120, 200, 210, 220 described above and representatively illustrated in FIGS. 1-5 may be considered substantially horizontally oriented. FIGS. 6, 7, 8, and 9 are diagrams of an integrated capacitor 80 with substantially vertical orientation in accordance with various embodiments of the present disclosure. A first layer 60 of the integrated capacitor 80 is shown in FIG. 6. A first conductive line (port) 600 and a second conductive line (port) 610 extend substantially in the X direction indicated in FIG. 6. The second conductive line 610 is separated from the first conductive line 600 by a separation. Third conductive lines 601-604 electrically connected to (e.g., monolithically formed with) the first conductive line 600 extend into the separation substantially in the negative Y direction indicated in FIG. 6. Fourth conductive lines 611-614 electrically connected to (e.g., monolithically formed with) the second conductive line 610 extend into the separation substantially in the Y direction. The third conductive lines 601-604 and the fourth conductive lines 611-614 are arranged in a substantially interdigitated configuration as shown in FIG. 6. For example, the third conductive line 601 is adjacent the fourth conductive lines 611, 612. Dielectric extends between the first, second, third and fourth conductive lines 600, 610, 601-604, 611-614. In some embodiments, the dielectric completely fills between the first, second, third and fourth conductive lines 600, 610, 601-604, 611-614.

In some embodiments, external connections (positive/negative plate connections) to the integrated capacitor 80 may be made using lines or ports connected to the third conductive line 600 and the fourth conductive line 610. In other embodiments, external connections to the integrated capacitor 80 may be made at the first conductive line 600 and the second conductive line 610. In other embodiments, external connection to the integrated capacitor 80 may be made at the third conductive line 600 and the fourth conductive line 610, or at the third conductive line 600 and the second conductive line 610.

A second layer 70 of the integrated capacitor 80 is representatively illustrated in FIG. 7. A first conductive line (port) 700 and a second conductive line (port) 710 extend substantially in the Y direction indicated in FIG. 7 (the same Y direction as indicated in FIG. 6). The second conductive line 710 is separated from the first conductive line 700 by a separation. In some applications, external connection to the integrated capacitor 80 may be made by lines/ports electrically connected to the first conductive line (port) 700 and the second conductive line 710, instead of using the first conductive line 700 and second conductive line 710 directly. In other applications, other choices for using the first and second conductive lines 700, 710 for input/output ports are also available. Third conductive lines 701-704 electrically connected to (e.g., monolithically formed with) the first conductive line 700 extend into the separation substantially in the X direction indicated in FIG. 7. Fourth conductive lines 711-714 electrically connected to (e.g., monolithically formed with) the second conductive line 710 extend into the separation substantially in the negative X direction. The third conductive lines 701-704 and the fourth conductive lines 711-714 are arranged in a substantially interdigitated configuration as representatively illustrated in FIG. 7. For example, the fourth conductive line 711 is adjacent the third conductive lines 701, 702. Dielectric extends between the first, second, third, and fourth conductive lines 700, 710, 701-704, 711-714. In some embodiments, the dielectric completely fills between the first, second, third and fourth conductive lines 700, 710, 701-704, 711-714.

In some embodiments, external connections (e.g., positive/negative plate connections) to the integrated capacitor 80 may be made using lines or ports connected to the third conductive line 700 and the fourth conductive line 710. In other embodiments, external connections to the integrated capacitor 80 may be made at the first conductive line 700 and the second conductive line 710. In other embodiments, external connection to the integrated capacitor 80 may be made at the third conductive line 700 and the fourth conductive line 710, or at the third conductive line 700 and the second conductive line 710.

A sectional view of the integrated capacitor 80 taken along the cross-sectional line 8-8 in FIG. 6 and FIG. 7 is shown in FIG. 8. A further sectional view of the integrated capacitor 80 taken along the cross-sectional line 9-9 in FIG. 6 and FIG. 7 is shown in FIG. 9. Six layers are shown in FIG. 8 and FIG. 9, including the first layer 60 and the second layer 70. In some embodiments, fewer or more than six layers may be included in the integrated capacitor 80. A first electrode (e.g., plate, node) of the integrated capacitor 80 is visually differentiated in FIGS. 8 and 9 from a second electrode (e.g., plate, node) of the integrated capacitor 80 by hatching of conductive lines. The fourth conductive line 612 and the third conductive lines 702-704 form part of the first electrode, as representatively illustrated in FIG. 8. Conductive vias electrically connect the fourth conductive line 612 to the third conductive lines 702-704. The third conductive line 602 and the fourth conductive lines 711-713 form part of the second electrode, as representatively illustrated in FIG. 9. Conductive vias electrically connect the third conductive line 602 to the fourth conductive lines 711-713.

A third layer of the integrated capacitor 80 may be below the second layer and separated from the second layer by dielectric. A conductive line 622 (FIG. 9) in the third layer forms part of the first electrode, while a conductive line 632 (FIG. 8) in the third layer forms part of the second electrode. The conductive line 622 is substantially overlapped by the conductive line 602, and is electrically connected to the fourth conductive lines 712, 713 in the second layer, as well as conductive lines 722-724 in a fourth layer. The conductive line 632 is substantially overlapped by the conductive line 612, and is electrically connected to the third conductive lines 702, 703 in the second layer, as well as conductive lines 731-733 in the fourth layer. The fourth layer is below the third layer, and separated from the third layer by dielectric.

A fifth layer of the integrated capacitor 80 may be below the fourth layer and separated from the fourth layer by dielectric. A conductive line 652 (FIG. 8) in the fifth layer forms part of the first electrode, while a conductive line 642 (FIG. 9) in the fifth layer forms part of the second electrode. The conductive line 652 is substantially overlapped by the conductive line 632, and is electrically connected to conductive lines 732, 733 in the fourth layer, as well as conductive lines 742-744 in a sixth layer. The conductive line 642 is substantially overlapped by the conductive line 622, and is electrically connected to conductive lines 722, 723 in the second layer, as well as conductive lines 751-753 in the sixth layer. The sixth layer is below the fifth layer, and separated from the fifth layer by dielectric.

Representative embodiments may achieve advantages. For example, the integrated capacitors 50, 80 may have lower parasitic resistance and inductance compared to other integrated capacitors, at least due to, e.g., the relatively short conductive stubs 102-105, 112-115, and 122-125 in the integrated capacitor 50.

FIG. 10 is a process flow to form a capacitor according to various representative embodiments of the present disclosure. This process flow may be used to form the capacitor 80 illustrated in FIGS. 8 and 9. In step 1020, a dielectric layer is deposited over a substrate. In integrated circuit embodiments, the substrate may be a semiconductor substrate, such as silicon, germanium, silicon germanium, silicon carbide, or the like, and may further be a bulk semiconductor material, a semiconductor on insulator (SOI), or the like. In some embodiments, the substrate also comprises any number of other dielectric layers and comprises various types of devices in the semiconductor material and/or in the dielectric layers. In interposer embodiments, the substrate may be silicon oxide, silicon, a glass, aluminum oxide, or the like, and may also have any number of dielectric layers. Other embodiments contemplate similar features. The dielectric layer formed over the substrate may be, for example, silicon oxide, borophosphosilicate glass (BPSG), undoped silicate glass (USG), fluorinated silicate glass (FSG), low-k dielectric materials, high-k materials, the like, or a combination thereof, and may be deposited by a chemical vapor deposition (CVD), physical vapor deposition (PVD), atomic layer deposition (ALD), a spin-on-dielectric process, the like, or a combination thereof.

In step 1022, recesses are formed in the deposited dielectric layer for electrode patterns and/or vias. This may be performed using acceptable photolithograpy and etching techniques. For example, a photoresist may be spun-on to the dielectric layer and patterned according to the pattern of the vias and/or electrode patterns using a light exposure. The pattern of the photoresist can then be transferred to the dielectric layer by anisotropically etching, such as by a reactive ion etch (RIE) or the like. In step 1024, the recesses are filled with conductive material, such as copper, aluminum, titanium, tungsten, alloys thereof, nitrides thereof, the like, or a combination thereof, with or without a barrier layer, to form the electrode patterns and/or vias. Excess conductive material may be removed by a chemical mechanical polish (CMP) or the like. This process of forming the electrodes and/or vias may be a damascene process, such as a single or dual damascene. In step 1026, another dielectric layer is deposited, similar to step 1020. Steps 1022 through 1026 may then be repeated as many times as necessary for an application to form a stacked capacitor, such as the capacitor 80 shown in FIGS. 8 and 9.

FIG. 11 illustrates another process flow to form a capacitor according to various embodiments. In step 1130, a seed layer is deposited over a substrate. In addition to the substrates discussed with respect to FIG. 10, the substrate may be an organic substrate or a layer within an organic substrate, such as used in packaging integrated circuit chips. The seed layer may be deposited using, for example, PVD or the like. In step 1032, a photoresist is formed, such as by a spin-on process, on the seed layer and is patterned in the pattern of the electrodes, such as by exposure to light. In step 1034, conductive material, such as discussed previously, is plated, such as by an electroless plating or the like, in the openings of the photoresist and on the seed layer. In step 1036, the photoresist is removed, such as with an ash process. In step 1038, a dielectric material is formed over the electrodes. The dielectric material may be any of the dielectric material discussed with respect to FIG. 10 formed in a similar manner. Further, in packaging embodiments, the dielectric material may be a molding compound formed by compression molding, injection molding, or the like. When a molding compound is used as the dielectric material, an air gap may be formed between the electrodes in the capacitor because the molding compound may not form between the electrodes. If a stacked capacitor is to be formed, steps 1040 and 1042 are performed and steps 1030 through 1032 are repeated as needed for a particular application. In step 1040, a recess for a via is formed in the dielectric material, such as by using acceptable photolithography and etching techniques. In step 1042, the recesses are filled with conductive material to form the vias, such as by depositing the conductive material and removing any excess, similar to as discussed above.

In accordance with various embodiments of the present disclosure, a capacitor integrated on a substrate includes a first conductive port, and a second conductive port electrically isolated from and capacitively coupled to the first conductive port. The capacitor further includes first, second, third, and fourth conductive features. The first conductive feature is formed in a first conductive layer, and includes a first conductive line extending substantially perpendicularly from the first conductive port, at least two first conductive stubs extending substantially perpendicularly from the first conductive line in a first direction, and at least two second conductive stubs extending substantially perpendicularly from the first conductive line in a second direction opposite the first direction. The second conductive feature is formed in the first conductive layer, and includes a second conductive line extending substantially perpendicularly from the second conductive port, at least two third conductive stubs extending substantially perpendicularly from the second conductive line in the first direction, and at least two fourth conductive stubs extending substantially perpendicularly from the second conductive line in the second direction. The third conductive feature is formed in a second conductive layer over the first metal layer, and includes a third conductive line extending substantially perpendicularly from the second conductive port, the third conductive line aligned with the first conductive line, at least two fifth conductive stubs extending substantially perpendicularly from the third conductive line in the first direction, the fifth conductive stubs substantially aligned with the first conductive stubs, and at least two sixth conductive stubs extending substantially perpendicularly from the third conductive line in the second direction, the sixth conductive stubs substantially aligned with the second conductive stubs. The fourth conductive feature is formed in the second conductive layer, and includes a fourth conductive line extending substantially perpendicularly from the first conductive port, the fourth conductive line substantially aligned with the second conductive line, at least two seventh conductive stubs extending substantially perpendicularly from the second conductive line in the first direction, the seventh conductive stubs substantially aligned with the third conductive stubs, and at least two eighth conductive stubs extending substantially perpendicularly from the second conductive line in the second direction, the eighth conductive stubs substantially aligned with the fourth conductive stubs.

In accordance with various embodiments of the present disclosure, a capacitor integrated in an integrated circuit (IC) includes a first conductive structure, a second conductive structure, a first interconnect structure, and a second interconnect structure. The first conductive structure forms a portion of a first node of the capacitor and includes a first conductive line formed in a first conductive layer and extending in a first direction, a second conductive line formed in a second conductive layer above the first conductive layer and extending in a second direction substantially perpendicular to the first direction, and two third conductive lines formed in a third conductive layer above the second conductive layer and extending in the first direction. The second conductive structure forms a portion of a second node of the capacitor and includes a fourth conductive line formed in the first conductive layer and extending in the first direction, a fifth conductive line formed in the second conductive layer and extending in the second direction, and a sixth conductive line formed in the third conductive layer, between the two third conductive lines, and extending in the first direction. The first interconnect structure includes at least three first conductive vias electrically connecting the first conductive line to the second conductive line and the two third conductive lines. The second interconnect structure includes at least two second conductive vias electrically connecting the fourth conductive line to the fifth conductive line and the sixth conductive line.

In accordance with various embodiments of the present disclosure, a method comprises forming a first electrode pattern in a first dielectric layer over a substrate, the first electrode pattern comprising a metal, the first electrode pattern comprising a first elongated member with a first side and a second side opposite the first side, the first electrode pattern further comprising first fingers extending from the first side of the first elongated member and second fingers extending from the second side of the first elongated member; and forming a second electrode pattern in the first dielectric layer, the second electrode pattern comprising a metal, the second electrode pattern comprising a second elongated member and a third elongated member, the second electrode pattern further comprising third fingers extending from the second elongated member and fourth fingers extending from the third elongated member, the first fingers being interdigitated with the third fingers, the second fingers being interdigitated with the fourth fingers.

In accordance with a representative embodiment, a method includes forming a first electrode pattern in a first dielectric layer over a substrate, the first electrode pattern comprising a metal, the first electrode pattern comprising a first elongated member with a first side and a second side opposite the first side, the first electrode pattern further comprising first stubs extending from the first side of the first elongated member and second stubs extending from the second side of the first elongated member; and forming a second electrode pattern in the first dielectric layer, the second electrode pattern comprising a metal, the second electrode pattern comprising a second elongated member and a third elongated member, the second electrode pattern further comprising third stubs extending from the second elongated member and fourth stubs extending from the third elongated member, the first stubs being substantially interdigitated with the third stubs, the second stubs being substantially interdigitated with the fourth stubs.

In accordance with another representative embodiment, a method includes forming a first conductive port; forming a second conductive port electrically isolated from and capacitively coupled to the first conductive port; forming a first conductive feature in a first conductive layer, the first conductive feature comprising a first conductive line extending perpendicularly from the first conductive port, at least two first conductive stubs extending perpendicularly from the first conductive line in a first direction, and at least two second conductive stubs extending perpendicularly from the first conductive line in a second direction, the second direction substantially antiparallel to the first direction, the at least two second conductive stubs staggered with the at least two first conductive stubs along the first conductive line; forming a second conductive feature in the first conductive layer, the second conductive feature comprising a second conductive line extending perpendicularly from the second conductive port, at least two third conductive stubs extending perpendicularly from the second conductive line in the first direction, and at least two fourth conductive stubs extending perpendicularly from the second conductive line in the second direction, the at least two fourth conductive stubs staggered with the at least two third conductive stubs along the second conductive line; forming a third conductive feature in a second conductive layer over the first conductive layer, the third conductive feature comprising a third conductive line extending perpendicularly from the second conductive port, the third conductive line aligned with the first conductive line, at least two fifth conductive stubs extending perpendicularly from the third conductive line in the first direction, the fifth conductive stubs aligned with the first conductive stubs, and at least two sixth conductive stubs extending perpendicularly from the third conductive line in the second direction, the sixth conductive stubs aligned with the second conductive stubs; and forming a fourth conductive feature in the second conductive layer, the fourth conductive feature comprising a fourth conductive line extending perpendicularly from the first conductive port, the fourth conductive line aligned with the second conductive line, at least two seventh conductive stubs extending perpendicularly from the second conductive line in the first direction, the seventh conductive stubs aligned with the third conductive stubs, and at least two eighth conductive stubs extending perpendicularly from the fourth conductive line in the second direction, the eighth conductive stubs aligned with the fourth conductive stubs.

In accordance with yet another representative embodiment, a method includes forming a first conductive structure comprising at least a portion of a first node of a capacitor, forming the first conductive structure comprising: forming a first conductive line in a first conductive layer and extending in a first direction, the first conductive line extending in a first plane along the first direction; forming a second conductive line in a second conductive layer above the first conductive layer, the second conductive line extending in a second direction substantially perpendicular to the first direction; and forming at least two third conductive lines in a third conductive layer above the second conductive layer, the at least two third conductive lines extending in the first direction, one of the at least two third conductive lines extending in a second plane along the first direction; forming a second conductive structure comprising at least a portion of a second node of the capacitor, forming the second conductive structure comprising: forming a fourth conductive line in the first conductive layer and extending in the first direction, the fourth conductive line extending in the second plane; forming a fifth conductive line in the second conductive layer and extending in the second direction; and forming a sixth conductive line in the third conductive layer, between the two third conductive lines, and extending in the first direction, the sixth conductive line extending in the first plane; forming a first interconnect structure comprising at least three first conductive vias electrically connecting the first conductive line to the second conductive line and the two third conductive lines; and forming a second interconnect structure comprising at least two second conductive vias electrically connecting the fourth conductive line to the fifth conductive line and the sixth conductive line.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or contextual variants thereof are used in either the detailed description or the claims, such terms are intended to be inclusive in a manner similar to the term "comprising." Moreover, the term "between," as used herein, is generally inclusive (e.g., "between A and B" includes inner edges of A and B).

Although present embodiments and associated advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, articles of manufacture, composition of matter, means, methods, and/or steps described in the specification. As one of ordinary skill in the art will readily appreciate from the disclosure, processes, machines, articles of manufacture, compositions of matter, means, methods, and/or steps, presently existing or later to be developed, that perform substantially the same function or achieve substantially the same result as corresponding embodiments described herein may be utilized according to the present disclosure. Accordingly, the appended claims are intended to include within their scope such processes, machines, articles of manufacture, compositions of matter, means, methods, and/or steps.

What is claimed is:

1. A method comprising:
forming a first electrode pattern in a first dielectric layer over a substrate, the first electrode pattern comprising a metal, the first electrode pattern comprising a first elongated member with a first side and a second side opposite the first side, the first electrode pattern further comprising first stubs extending from the first side of the first elongated member and second stubs extending from the second side of the first elongated member; and
forming a second electrode pattern in the first dielectric layer, the second electrode pattern comprising a metal, the second electrode pattern comprising a second elongated member and a third elongated member, the second electrode pattern further comprising third stubs extending from the second elongated member and fourth stubs extending from the third elongated member, the first stubs being substantially interdigitated with the third stubs, the second stubs being substantially interdigitated with the fourth stubs.

2. The method of claim 1, wherein the first stubs and the second stubs are staggered by a first distance smaller than a second distance between the first elongated member and the second elongated member.

3. The method of claim 2, wherein the third stubs and the fourth stubs are staggered by a third distance smaller than the second distance, the third distance substantially equal to the first distance.

4. The method of claim 1, wherein each of the first, second, third, and fourth stubs have a same length.

5. The method of claim 1, wherein the first dielectric layer electrically isolates the first electrode pattern from the second electrode pattern.

6. The method of claim 1, wherein forming the first electrode pattern comprises forming a fourth elongated member and fifth stubs extending from the fourth elongated member, and forming the second electrode pattern comprises forming sixth stubs extending from the second elongated member on a side opposite from the third stubs, the fifth stubs being substantially interdigitated with the sixth stubs.

7. The method of claim 1, wherein forming the first electrode pattern comprises forming a first spine, the first elongated member extending from the first spine, and forming the second electrode pattern comprises forming a second spine, the second elongated member and the third elongated member extending from the second spine.

8. The method of claim 1, further comprising:
forming a second dielectric layer over the first dielectric layer;
forming a third electrode pattern in the second dielectric layer, the third electrode pattern comprising a metal, the third electrode pattern being electrically coupled to the first electrode pattern; and
forming a fourth electrode pattern in the second dielectric layer, the fourth electrode pattern comprising a metal, the fourth electrode pattern being electrically coupled to the second electrode pattern.

9. The method of claim 8, wherein the third electrode pattern and the fourth electrode pattern are rotated 90 degrees with respect to the first electrode pattern and the second electrode pattern, respectively.

10. The method of claim 8, further comprising:
forming a first via in the second dielectric layer to electrically couple the first electrode pattern and the third electrode pattern; and
forming a second via in the second dielectric layer to electrically couple the second electrode pattern and the fourth electrode pattern.

11. A method comprising:
forming a first conductive port;
forming a second conductive port electrically isolated from and capacitively coupled to the first conductive port;
forming a first conductive feature in a first conductive layer, the first conductive feature comprising a first conductive line extending perpendicularly from the first conductive port, at least two first conductive stubs extending perpendicularly from the first conductive line in a first direction, and at least two second conductive stubs extending perpendicularly from the first conductive line in a second direction, the second direction substantially antiparallel to the first direction, the at least two second conductive stubs staggered with the at least two first conductive stubs along the first conductive line;
forming a second conductive feature in the first conductive layer, the second conductive feature comprising a second conductive line extending perpendicularly from the second conductive port, at least two third conductive stubs extending perpendicularly from the second conductive line in the first direction, and at least two fourth conductive stubs extending perpendicularly from the second conductive line in the second direction, the at least two fourth conductive stubs staggered with the at least two third conductive stubs along the second conductive line;

forming a third conductive feature in a second conductive layer over the first conductive layer, the third conductive feature comprising a third conductive line extending perpendicularly from the second conductive port, the third conductive line aligned with the first conductive line, at least two fifth conductive stubs extending perpendicularly from the third conductive line in the first direction, the fifth conductive stubs aligned with the first conductive stubs, and at least two sixth conductive stubs extending perpendicularly from the third conductive line in the second direction, the sixth conductive stubs aligned with the second conductive stubs; and forming a fourth conductive feature in the second conductive layer, the fourth conductive feature comprising a fourth conductive line extending perpendicularly from the first conductive port, the fourth conductive line aligned with the second conductive line, at least two seventh conductive stubs extending perpendicularly from the second conductive line in the first direction, the seventh conductive stubs aligned with the third conductive stubs, and at least two eighth conductive stubs extending perpendicularly from the fourth conductive line in the second direction, the eighth conductive stubs aligned with the fourth conductive stubs.

12. The method of claim 11, wherein the first conductive stubs and the second conductive stubs are staggered by a first distance smaller than a second distance between the first conductive line and the second conductive line.

13. The method of claim 11, wherein each of the first, second, third, fourth, fifth, sixth, seventh, and eighth conductive stubs have a same length.

14. The method of claim 11, wherein the first conductive feature and the second conductive feature are electrically isolated from each other within the first conductive layer by dielectric material.

15. The method of claim 11, wherein:
forming the first conductive port comprises forming a fifth conductive line perpendicular to the first conductive line and the fourth conductive line; and
forming the second conductive port comprises forming a sixth conductive line perpendicular to the second conductive line and the third conductive line.

16. The method of claim 11, wherein the first conductive layer comprises a first metal layer of an integrated circuit having a substrate, and the second conductive layer comprises a second metal layer of the integrated circuit.

17. A method comprising:
forming a first conductive structure comprising at least a portion of a first node of a capacitor, the forming the first conductive structure comprising:
forming a first conductive line in a first conductive layer and extending in a first direction, the first conductive line extending in a first plane along the first direction,
forming a second conductive line in a second conductive layer above the first conductive layer, the second conductive line extending in a second direction substantially perpendicular to the first direction, and
forming at least two third conductive lines in a third conductive layer above the second conductive layer, the at least two third conductive lines extending in the first direction, one of the at least two third conductive lines extending in a second plane along the first direction;
forming a second conductive structure comprising at least a portion of a second node of the capacitor, the forming the second conductive structure comprising:
forming a fourth conductive line in the first conductive layer and extending in the first direction, the fourth conductive line extending in the second plane,
forming a fifth conductive line in the second conductive layer and extending in the second direction, and
forming a sixth conductive line in the third conductive layer, between the two third conductive lines, and extending in the first direction, the sixth conductive line extending in the first plane;
forming a first interconnect structure comprising at least three first conductive vias electrically connecting the first conductive line to the second conductive line and the two third conductive lines; and
forming a second interconnect structure comprising at least two second conductive vias electrically connecting the fourth conductive line to the fifth conductive line and the sixth conductive line.

18. The method of claim 17, wherein the first conductive line is substantially aligned with the sixth conductive line.

19. The method of claim 17, wherein:
the first conductive line and the fourth conductive line are electrically isolated from each other within the first conductive layer by a first dielectric material;
the second conductive line and the fifth conductive line are electrically isolated from each other within the second conductive layer by a second dielectric material; and
the third conductive lines and the sixth conductive line are electrically isolated from each other within the first conductive layer by a third dielectric material.

20. The method of claim 17, wherein the first conductive layer comprises a first metal layer of an integrated circuit (IC), the second conductive layer comprises a second metal layer of the IC, and the third conductive layer comprises a third metal layer of the IC.

* * * * *